United States Patent
Wnuk

(10) Patent No.: US 6,774,505 B1
(45) Date of Patent: Aug. 10, 2004

(54) VEHICLE SWITCH ASSEMBLY WITH PROXIMITY ACTIVATED ILLUMINATION

(75) Inventor: Joseph Wnuk, Westland, MI (US)

(73) Assignee: Lear Automotive Dearborn, Inc., Southfield, MI (US)

( * ) Notice: Subject to any disclaimer, the term of this patent is extended or adjusted under 35 U.S.C. 154(b) by 0 days.

(21) Appl. No.: 09/118,629

(22) Filed: Jul. 17, 1998

(51) Int. Cl.$^7$ ................................................. B60Q 1/26
(52) U.S. Cl. ...................................... 307/10.8; 307/117
(58) Field of Search ........................... 307/10.8, 112, 307/116, 117; 362/85, 501, 276; 200/310, 311, 312, 313, 314, 315, 316, 317

(56) References Cited

U.S. PATENT DOCUMENTS

| | | | | |
|---|---|---|---|---|
| 4,678,872 A | * | 7/1987 | Gutman | 200/5 R |
| 4,788,630 A | * | 11/1988 | Gavagan | 362/501 |
| 4,975,547 A | * | 12/1990 | Nakayama et al. | 200/315 |
| 5,149,924 A | * | 9/1992 | Priesemuth | 200/315 |
| 5,174,643 A | * | 12/1992 | Priesemuth | 362/61 |
| 5,336,859 A | * | 8/1994 | Wojtanek et al. | 200/315 |
| 5,350,889 A | * | 9/1994 | Lauritsen | 200/315 |
| 5,359,164 A | * | 10/1994 | Kucharski, Jr. | 200/315 |
| 5,384,440 A | * | 1/1995 | Wnuk et al. | 200/317 |
| 5,414,231 A | * | 5/1995 | Sato et al. | 200/315 |
| 5,434,377 A | * | 7/1995 | Martin et al. | 200/314 |
| 5,434,757 A | * | 7/1995 | Kashiwagi | 362/501 |
| 5,491,313 A | * | 2/1996 | Bartley et al. | 200/310 |
| 5,521,342 A | * | 5/1996 | Bartley et al. | 200/314 |
| 5,560,475 A | * | 10/1996 | Brundage et al. | 200/315 |
| 5,570,915 A | * | 11/1996 | Asadurian | 292/242 |
| 5,573,107 A | * | 11/1996 | Nakano et al. | 200/314 |
| 5,813,519 A | * | 9/1998 | Gotoh | 200/313 |
| 5,833,048 A | * | 11/1998 | Dilly | 200/315 |
| 5,880,538 A | * | 3/1999 | Schulz | 307/109 |
| 5,996,383 A | * | 12/1999 | Adelmeyer et al. | 362/100 |

FOREIGN PATENT DOCUMENTS

JP    08-113098    *   7/1996

OTHER PUBLICATIONS

"Circuit Design for Electronics Instrumentation", Second Edition; Wobschall, Darold; pp. 253–255, 1987.*

* cited by examiner

*Primary Examiner*—Brian Sircus
*Assistant Examiner*—Roberto J. Rios
(74) *Attorney, Agent, or Firm*—Bill C. Panagos

(57) ABSTRACT

The inventive vehicle switch assembly includes a switch for producing a signal to control a vehicle accessory, a light for illuminating the assembly, and a sensor for actuating the light in response to detecting an object in proximity to the switch. Preferably, the switch is illuminated only when a hand of a vehicle occupant is placed within a predetermined distance of the switch.

3 Claims, 2 Drawing Sheets

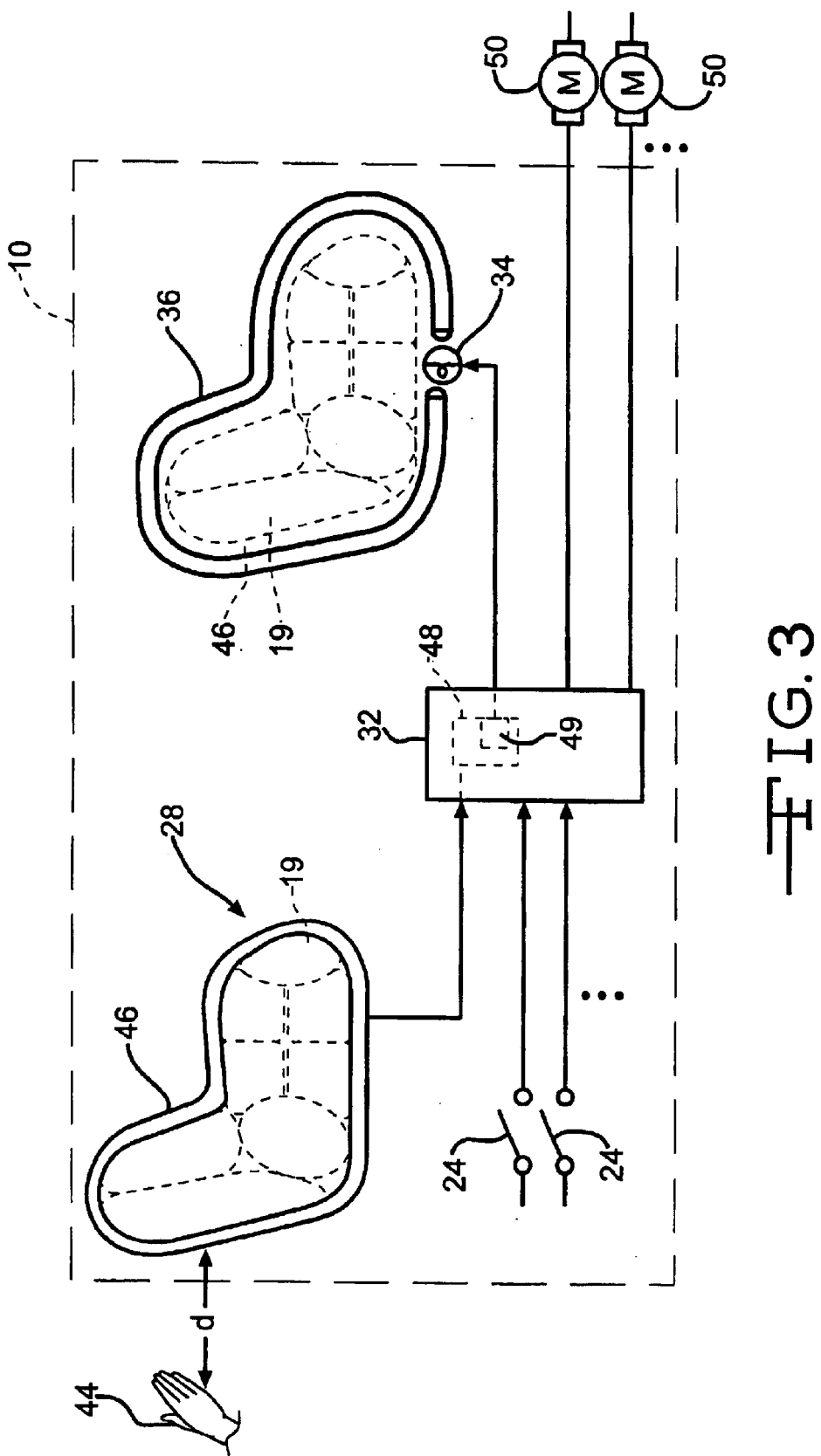

VEHICLE SWITCH ASSEMBLY WITH PROXIMITY ACTIVATED ILLUMINATION

BACKGROUND OF THE INVENTION

This invention relates to a vehicle switch assembly with proximity activated illumination.

Modern vehicles include a large number of electrical input switches, such as door lock/unlock, window open/ close, seat control switches, etc. These electrical input switches may include a backlighting or illumination feature which is operated simultaneously with the headlights of the vehicle. The backlighting or illumination feature is intended to assist a driver or other vehicle occupant in locating the input switch during low light conditions. Typically, when the vehicle headlights are switched on, the electrical input switches are backlit by a bulb or LED (light emitting diode) positioned underneath the cover of the switch or illuminated by a beam of light directed at the switch from a remote location. When the vehicle headlights are switched off, the backlighting or illumination of the electrical input switches is also switched off.

Backlit switches are easily located in the dark, however some illumination deficiencies remain. For example, it may be difficult to locate an input switch at dusk when the vehicle headlights, and therefore the switch backlighting/ illumination, are off. Further, continuously backlit switches may create nighttime glare problems. Accordingly, there is a desire to provide a vehicle switch assembly which is illuminated only when the driver or other vehicle occupant reaches to use the switch.

SUMMARY OF THE INVENTION

In a disclosed embodiment of this invention, a vehicle switch assembly includes a switch for producing a signal to control a vehicle accessory, a light for illuminating the assembly, and a sensor for actuating the light in response to detecting an object in proximity to the switch. Preferably, the switch is illuminated only when a hand of a vehicle occupant is placed within a predetermined distance of the switch.

In a preferred embodiment of this invention, the light consists of a bulb for producing a beam of light and a fiber optic light pipe optically connected to the bulb for receiving the beam of light and illuminating the switch assembly.

In another preferred embodiment of this invention, the sensor consists of a foil strip and the switch assembly further includes a control having an illumination circuit. The approach of the occupant's hand towards the switch assembly changes the capacitance of the foil strip which triggers the illumination circuit to illuminate the light.

These and other features of the present invention will be best understood from the following specification and drawings, the following of which is a brief description.

BRIEF DESCRIPTION OF THE DRAWINGS

FIG. 3 is an electrical schematic diagram of the vehicle switch assembly.

DETAILED DESCRIPTION OF THE PREFERRED EMBODIMENT

Figure 1:
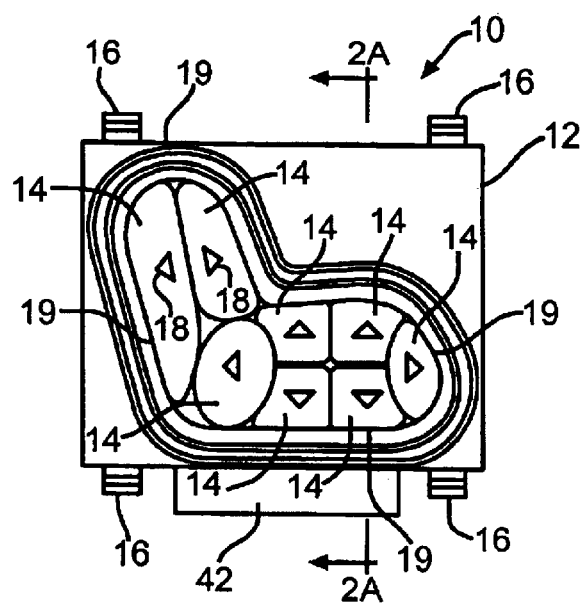
FIG. 1 is a top view of a vehicle switch assembly in accordance with the present invention.

FIG. 1 is a top view of a vehicle switch assembly 10 in accordance with the present invention. The switch assembly 10 is intended to control one or more vehicle accessories or functions. For example purposes, the switch assembly 10 shown in FIG. 1 is designed to control the movement of a power seat. However, the present invention extends to other switches. The switch assembly 10 includes a housing 12, a plurality of switch covers 14, and a plurality of locking tabs 16 extending outward from the housing 12. Typically, the switch covers 14 are silkscreened or embossed with indicia 18 symbolizing the control function of the switch assembly 10. The illustrated switch assembly 10 consists of eight switch covers 14 configured to form a figure of a seat 19 and each switch cover 14 includes indicia 18, here a triangle, indicating the direction of control or movement of the seat respectively. The invention of this application extends to other switches, and the illustrated switch is shown only as an example.

Figure 2A:
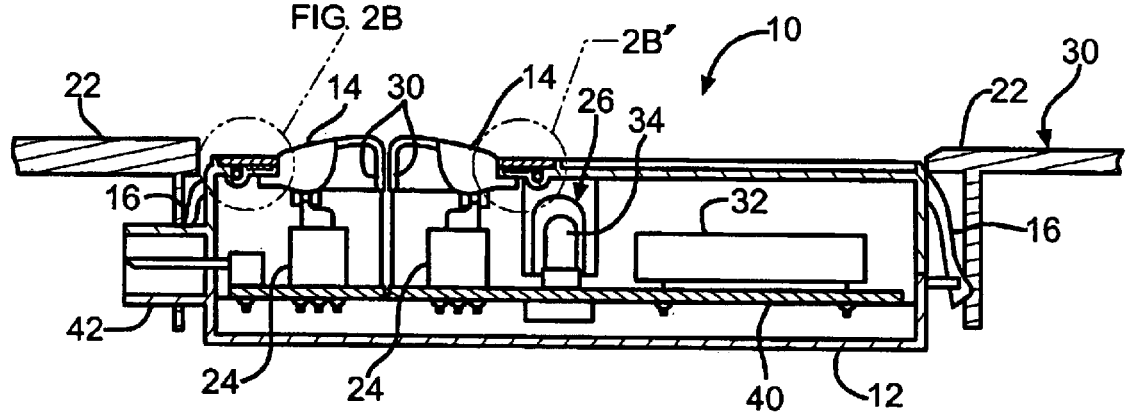
FIG. 2A is an enlarged, cross-sectional view of the vehicle switch assembly taken along lines 2A—2A in FIG. 1, showing the vehicle switch assembly installed in a vehicle.

FIG. 2A is an enlarged, cross-sectional view of the vehicle switch assembly 10 taken along lines 2A—2A in FIG. 1. The switch assembly 10 is shown installed in a vehicle 20, illustrated schematically. The locking tabs 16 mount the switch assembly 10 to the vehicle 20. Typically, the switch assembly 10 is snapped into an inner front door trim piece 22 in the vehicle 20. In this manner, the switch assembly 10 may be installed into the vehicle 20 without the use of tools or fasteners. The switch covers 14 of the assembly 10 are preferably mounted flush with the surface of the inner front door trim piece 22. Mounting the switch assembly 10 flush with the surface of the inner front door trim piece 22 reduces the possibility of unintentional activation of the switch assembly 10 causing the seat to move.

Figure 2B:
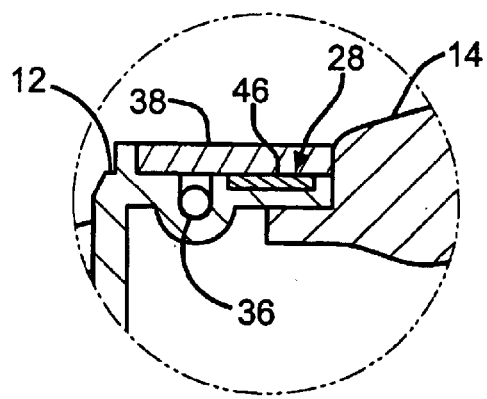
FIG. 2B is an enlarged view along line 2B of FIG. 2A. Notably, the line 2B of FIG. 2B is a mirror image of FIG. 2B.

The switch assembly 10 includes a plurality of switches 24 for producing signals to control a vehicle accessory and a light 26 for illuminating the switch assembly 10. As shown in FIG. 2B, a sensor 28 for actuating the light 26 in response to detecting an object in proximity to the switch assembly 10 is incorporated into the housing 12.

The plurality of switches 24 consists of conventional low current tack switches as shown in FIG. 2A. Each switch 24 is covered by a switch cover 14 respectively. To move the seat in a specific direction, a vehicle occupant must depress the appropriate switch cover 14 to activate the respective switch 24. Each switch cover 14 is attached to the switch assembly 10 with a living hinge 30. After a switch cover 14 has been depressed, the respective living hinge 30 returns the switch cover 14 to a normally raised position.

Light 26 may be any type of illumination device, including a bulb or LED (light emitting diode), positioned anywhere within the vehicle 20 provided the light 26 can illuminate the switch covers 14. Accordingly, the light 26 may be positioned underneath the switch covers 14, adjacent the switch covers 14, or at a remote location from the switch assembly 10.

In further accordance with the spirit of the present invention, the sensor 28 may be any type of detecting device, including a motion sensor, heat sensor, or proximity sensor, provided that the sensor 28 can detection the presence of a hand within a predetermined distance or proximity of the switch assembly 10. Such sensors are known, and the provision of such sensors is within the skill of a worker in the art.

In a preferred embodiment of the present invention, the switch assembly 10 includes a control 32 for receiving an actuation signal from the sensor 28 when an object is detected in proximity to the switch assembly 10 and for actuating the light 26 in response to the actuation signal. Preferably, the control 32 is an integrated circuit (IC).

The light 26 consists of a bulb 34 for producing a beam of light and a fiber optic light pipe 36 optically connected to the bulb 34 and positioned about the perimeter of the switch assembly 10 for receiving the beam of light and illuminating the switch assembly 10. In this embodiment, the fiber optic light pipe 36 is routed underneath an applique 38 about the perimeter of the switch covers 14 or the figure of the seat 19, best seen in FIG. 1.

Preferably, the switch assembly 10 further includes a circuit board 40 for supporting the plurality of switches 24, the bulb 34, and the control 32. Additionally, the switch assembly 10 includes a connector 42 molded in the housing 12 and integrated with the circuit board 40.

FIG. 3 is an electrical schematic diagram of the vehicle switch assembly 10. The sensor 28 is designed to detect a hand 44 approaching the switch assembly 10. The sensor 28 consists of a foil strip 46, a capacitance triggered switching circuit 48, and a voltage regulator to maintain a stable operation voltage. The switching circuit 48 is housed in the control 32. The foil strip 46 is a strip of metal routed underneath the applique 38, best seen in FIG. 2B, about the perimeter of the switch covers 14 or the figure of the seat 19, best seen in FIG. 1. The foil strip 46 operates as an input circuit to the switching circuit 48. The circuit 48 provides voltage on the foil strip 46. When a hand 44 is placed within a predetermined distanced, d, of the foil strip 46, the capacitance of the foil strip 46 is changed. The change in the capacitance of the foil strip 46 triggers a one-shot timer circuit in the switching circuit 48 and illuminates the bulb 34. The on-time of the one-shot timer circuit can be adjusted by changing the resistance or capacitance to change the time constant of the one-shot timer circuit. The bulb is illuminated until the one-shot timer circuit times out. One of ordinary skill in the art will recognize that the switching circuit 48 may be designed to illuminate the bulb 34 only when the hand 44 is within the predetermined distance, d, of the foil strip 46 instead of illuminating the bulb 34 for the on-time of the one-shot timer circuit. The beam of light created by the illuminated bulb 34 is transmitted by the fiber optic light pipe 36 to illuminate the switch assembly 10. In the aforementioned example, the switches 14 of the assembly 10 control one or more seat motors 50. The specific sensing technology described is known generally for detecting objects; however, the use of the sensing technology to actuate a light or in a vehicle switch application is novel.

Preferred embodiments of this invention have been disclosed, however, a worker of ordinary skill in the art would recognize that certain modifications would come within the scope of this invention. For that reason, the following claims should be studied to determine the true scope and content of this invention.

What is claimed is:

1. A switch assembly for a vehicle comprising:

a switch for producing a signal to control a vehicle accessory;

a light bulb for providing a beam of light;

a tubular fiber optic light pipe which extends about the periphery of said switch and optically connected to said light bulb for receiving said beam of light and illuminating said assembly; and a proximity sensor for producing an actuation signal in response to detecting an object in proximity to said switch; and a control including a one-shot timer circuit for actuating said light for a predetermined period of time in response to said actuation signal.

2. A switch assembly as set forth in claim 1 wherein said sensor consists of a foil strip and said control includes an illumination circuit.

3. A switch assembly as set forth in claim 2 wherein a change in the capacitance of said foil strip due to an approach of a human hand triggers said illumination circuit to illuminate said light.

* * * * *